US005258584A

United States Patent [19]

Hubbard

[11] Patent Number: 5,258,584

[45] Date of Patent: Nov. 2, 1993

[54] MULTIPLE AUXILIARY COMPOUND DRIVER LOUDSPEAKER SYSTEM

[75] Inventor: Jerry K. Hubbard, Yukon, Okla.

[73] Assignee: Donald E. Mitchell, Stillwater, Okla.

[21] Appl. No.: 770,548

[22] Filed: Oct. 3, 1991

[51] Int. Cl.[5] .............................................. H05K 5/00

[52] U.S. Cl. .................................. 181/147; 181/154; 181/155; 181/199; 381/89; 381/90; 381/186; 381/188

[58] Field of Search ............... 181/145, 147, 154, 155, 181/156, 163, 171, 199, 144; 381/89, 90, 170, 186, 188

[56] References Cited

U.S. PATENT DOCUMENTS 4,227,051 10/1980 Thomas et al. ..................... 181/146

4,256,922 3/1981 Görike ........................... 181/144 X

*Primary Examiner*—Michael L. Gellner

*Assistant Examiner*—Khanh Dang

*Attorney, Agent, or Firm*—Head & Johnson

[57] ABSTRACT

A compound driver loudspeaker system combines a single exterior radiating loudspeaker with a plurality of internal auxiliary loudspeakers in a cabinet. The cabinet has an external baffleboard and an internal baffleboard, the external baffleboard having a single baffle cutout for receiving the radiating loudspeaker and a plurality of internal baffleboard cutouts for receiving each of the auxiliary loudspeakers. The baffleboards and loudspeakers define a desirable air chamber between them. The auxiliary loudspeakers are selected to be smaller than the radiating loudspeaker and the number of auxiliary loudspeakers is such that, taken together, they form an equivalent single driver which is matched to the radiating loudspeaker to provide the desired frequency performance of the loudspeaker system. Since the auxiliary loudspeakers are smaller than the radiating loudspeaker, the baffle cutout in the external baffleboard is larger than the cutouts in the internal baffleboard. Therefore, the auxiliary speakers can be inserted into or removed from the air chamber through the cutout in the external baffleboard. Thus, the auxiliary loudspeakers can be front-mounted on the internal baffleboard and the radiating loudspeaker front-mounted on the external baffleboard to provide a front-to-back relationship between the auxiliary loudspeakers and the radiating loudspeaker.

19 Claims, 2 Drawing Sheets

MULTIPLE AUXILIARY COMPOUND DRIVER LOUDSPEAKER SYSTEM

BACKGROUND OF THE INVENTION

This invention relates generally to acoustic devices and more particularly concerns dynamic loudspeakers.

It is presently known to fasten two cone loudspeakers together in either front-to-front or front-to-back relationship such that the moving systems of both speakers are not restricted and a small volume of air is contained between the cones of the loudspeakers. The voice coils of the two speakers are electrically connected in series or parallel and phased such that a current flowing in them causes the cone and voice coil in each to move in the same direction. When so configured, at frequencies where the wavelength of sound is large compared to the dimensions of the air chamber between the loudspeaker cones, the two speakers act together as one equivalent driver. Therefore, they may be modeled as an equivalent driver to predict their theoretical low frequency performance in any type of enclosure. Loudspeakers used in such an arrangement are commonly referred to as compound driver, constant pressure or isobaric loudspeakers.

Present practice is to use two identical loudspeakers with characteristics as close to each other as possible. The low frequency performance for a single driver are determined by the Thiele-Small parameters of free air resonance frequency Fs, effective motor strength Qts and equivalent volume compliance Vas. For two identical loudspeakers in a compound configuration measured as an equivalent driver, Fs and Qts remain the same as for a single loudspeaker while Vas is one half the single loudspeaker value. Such a compound driver has the same low frequency performance as a single driver but requires only half the enclosure volume and has half the efficiency of the single driver.

Despite these desirable features, compound driver loudspeakers have not been widely successful as factory built systems. High volume production of loudspeaker cabinets uses the techniques of miterfold construction, which results in an enclosure with all glued joints and no removable panels. Therefore, all loudspeaker drivers are front mounted on the outside surfaces of the cabinet. The only type of conventional compound driver system that lends itself to this arrangement uses two identical speakers mounted front-to-front and fastened to the outside of the enclosure. A front-to-back compound driver arrangement with identical drivers and connecting air chamber is not possible unless a removable panel is included in the enclosure. The use of removable panels in cabinets increases costs and negatively impacts the operating characteristics of the system if proper sealing of the removable panel is not achieved.

Therefore, the primary object of this invention is to provide a front-to-back compound driver loudspeaker system which does not require use of a removable panel in its enclosure. Another object of the invention is to provide a front-to-back compound driver-loudspeaker system which allows mounting of internal drivers in close proximity to the rear of an external driver to minimize the connecting air chamber volume while still providing straight on access to the mounting hardware for the internal drivers. Another object of this invention is to provide a front-to-back compound driver system in which the parameters of the internal drivers result in an equivalent single driver properly matching the external driver to optimize low frequency performance.

SUMMARY OF THE INVENTION

In accordance with the invention a compound driver loudspeaker system combines a single exterior radiating loudspeaker with a plurality of internal auxiliary loudspeakers in a cabinet. The cabinet has an external baffleboard and an internal baffleboard, the external baffleboard having a single baffle cutout for receiving the radiating loudspeaker and the internal baffleboard having a plurality of baffle cutouts for receiving each of the auxiliary loudspeakers. The baffleboards and loudspeakers define a desirable air chamber between them. The auxiliary loudspeakers are selected to be smaller than the radiating loudspeaker and the number of auxiliary loudspeakers is such that, taken together, they form an equivalent single driver which is matched to the radiating loudspeaker to provide the desired frequency performance of the loudspeaker system. Since the auxiliary loudspeakers are smaller than the radiating loudspeaker, the baffle cutout in the external baffleboard is larger than the cutouts in the internal baffleboard. Therefore, the auxiliary speakers can be inserted into or removed from the air chamber through the cutout in the external baffleboard. Thus, the auxiliary loudspeakers can be front-mounted on the internal baffleboard and the radiating loudspeaker front-mounted on the external baffleboard to provide a front-to-back relationship between the auxiliary loudspeakers and the radiating loudspeaker.

Any number of variations of internal baffleboard and auxiliary loudspeaker combinations can be employed. In one preferred embodiment, a V-shaped internal baffleboard is used to define a vertical triangular air chamber with one auxiliary loudspeaker mounted on each face of the internal baffleboard. Another arrangement uses an internal baffleboard with four triangular faces to define a pyramid-like air chamber with an auxiliary loudspeaker mounted on each of the faces to provide a five-speaker system. A V-shaped internal baffleboard defining a vertical triangular air chamber with two auxiliary loudspeakers mounted on each internal baffleboard face will also provide a five loudspeaker system. An internal baffleboard having three rectangular faces and an equilaterally triangular face defining a horizontal triangular air chamber extending transversely in relation to the external baffleboard with an auxiliary loudspeaker mounted on the triangular face as well as each of the rectangular faces provides yet another five loudspeaker system.

Whatever the configuration of the internal baffleboard and whatever the selected number of auxiliary loudspeakers, a symmetrical disposition of auxiliary loudspeakers in relation to the radiating loudspeaker is preferred. The favored configuration of the internal baffleboard will allow mounting of the internal drivers in close proximity to the rear of the external driver to minimize the connecting air chamber volume while still providing straight access to the mounting hardware for the internal drivers. The use of a V-shaped baffleboard with two auxiliary loudspeakers has been found very effective for this purpose. The system allows for selection of a wide variety of auxiliary speaker numbers and sizes to provide a large number of possible system responses, thus satisfying the needs of each individual user.

BRIEF DESCRIPTION OF THE DRAWINGS:

Other objects and advantages of the invention will become apparent upon reading the following detailed description and upon reference to the drawings in which.

While the invention will be described in connection with one or more preferred embodiments, it will be understood that it is not intended to limit the invention to those embodiments. On the contrary, it is intended to cover all alternatives, modifications and equivalents as may be included within the spirit and scope of the invention as defined by the appended claims.

DETAILED DESCRIPTION OF THE INVENTION

Figure 1:
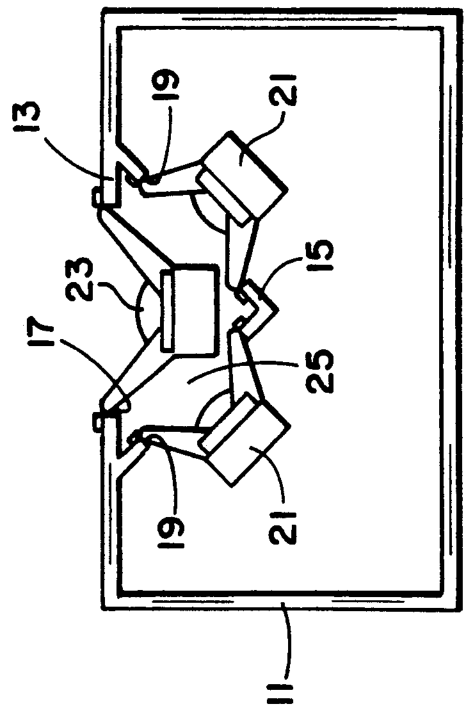
FIG. 1 is a top plan view of a typical loudspeaker cabinet with a vertical triangular air chamber combining two auxiliary loudspeakers with a single radiating loudspeaker.

Turning first to FIG. 1, a preferred embodiment of a compound driver loudspeaker system combining two auxiliary loudspeakers with a single radiating loudspeaker is illustrated. The speaker cabinet 11 has an external baffleboard 13 and an internal V-shaped baffleboard 15. The external baffleboard 13 has a large baffle cutout 17 and the V-shaped baffleboard 15 has a comparatively smaller baffle cutout 19 in each of its faces. A pair of auxiliary loudspeakers 21 which are insertable through the larger baffle cutout 17 are mounted in the small baffle cutouts 19 on the front face of the internal V-shaped baffleboard. The radiating loudspeaker 23 is mounted in the large baffle cutout 17 on the front face of the external baffleboard 13. It can thus be seen that, in this arrangement, the auxiliary loudspeakers 21 and the radiating loudspeaker 23 are mounted in front-to-back relationship without the need for any removable panels in the cabinet 11. It should also be noted that the external baffleboard 13 and internal V-shaped baffleboard 15 define a vertical triangular air chamber 25 of relatively low volume so as to provide the desired operational characteristics of the system.

Figure 3:
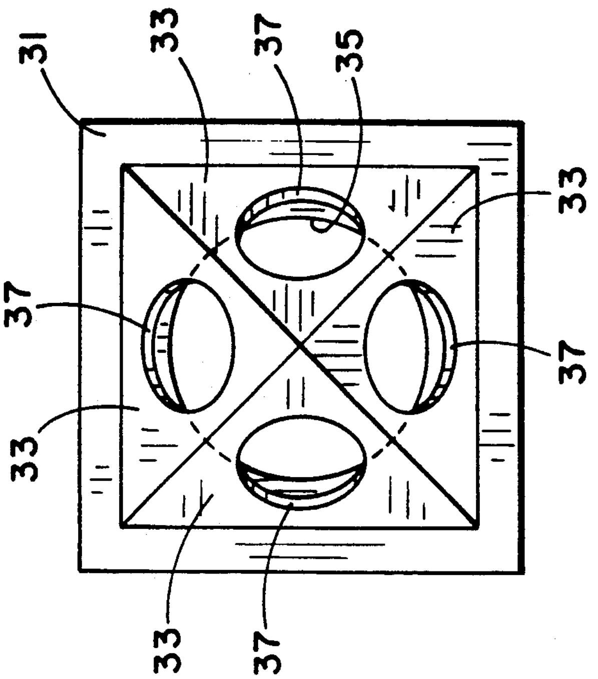
FIG. 3 is a rear elevation view of the air chamber of FIG. 2.
Figure 2:
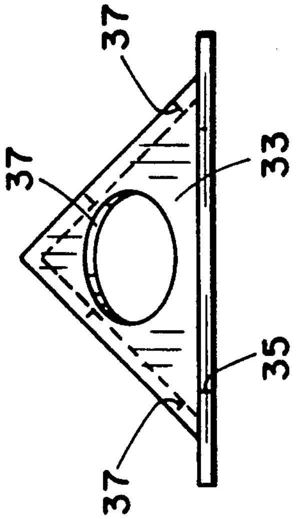
FIG. 2 is a bottom plan view of a pyramid-like air chamber for combining four auxiliary loudspeakers with a single radiating loudspeaker.

Turning to FIGS. 2 and 3, a pyramid-like air chamber for use with a compound driver loudspeaker system is illustrated. The air chamber is defined by an external baffle board 31 and an internal baffle board having four triangular faces 33. The external baffle board 31 has a large baffle cutout 35 and the internal baffle board has four comparatively smaller baffle cutouts 37, one disposed in each of the triangular faces 33. In this configuration, four auxiliary loudspeakers can be mounted in the smaller baffle cutouts 37 in similar fashion to that illustrated in FIG. 1 to drive a radiating loudspeaker mounted on the external baffle board 31 in a fashion similar to that shown in FIG. 1.

Figure 5:
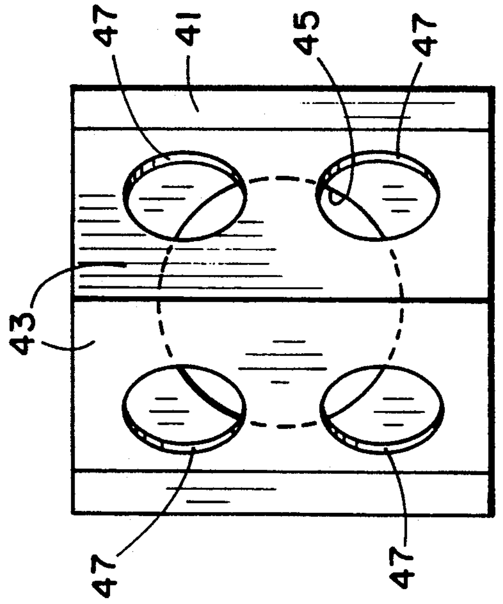
FIG. 5 is a rear elevation view of the vertical triangular air chamber of FIG. 4.
Figure 4:
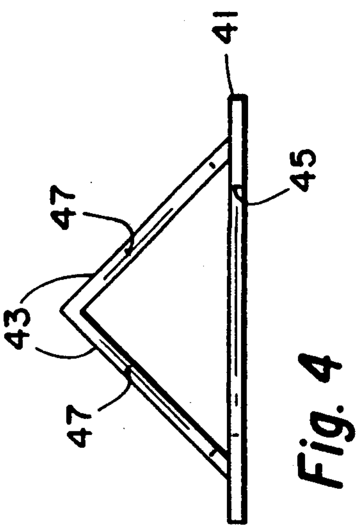
FIG. 4 is a bottom plan view of a vertical triangular air chamber for combining four auxiliary speakers with a single radiating loudspeaker.

Turning to FIGS. 4 and 5, a baffle board arrangement defining a vertical triangular air chamber for a compound driver loudspeaker system is illustrated. The chamber is defined by an external baffle board 41 and an internal baffle board having two rectangular faces 43 in a V-shaped configuration. The external baffle board 41 has a large baffle cutout 45 and the rectangular faces 43 each have two comparatively smaller baffle cutouts 47. The auxiliary and radiating loudspeakers are mounted in the smaller and larger baffle cutouts, respectively, in similar fashion as that hereinbefore described.

Figure 7:
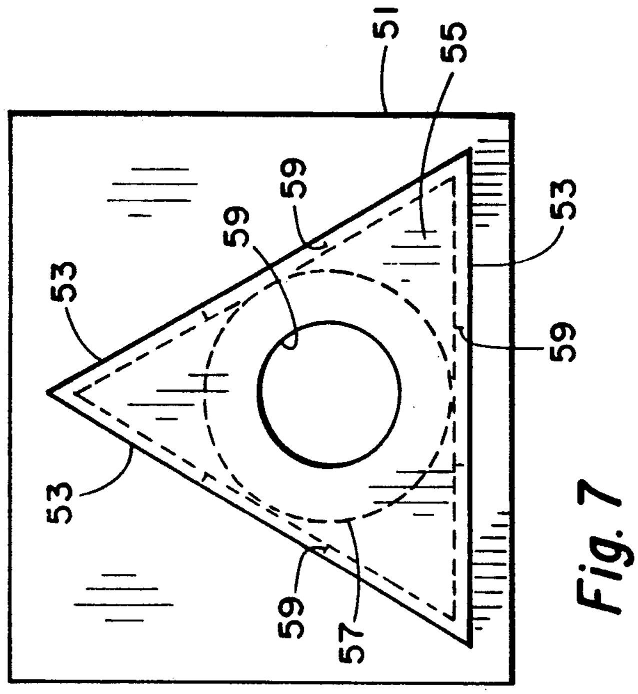
FIG. 7 is a rear elevation view of the horizontal triangular air chamber of FIG. 6.
Figure 6:
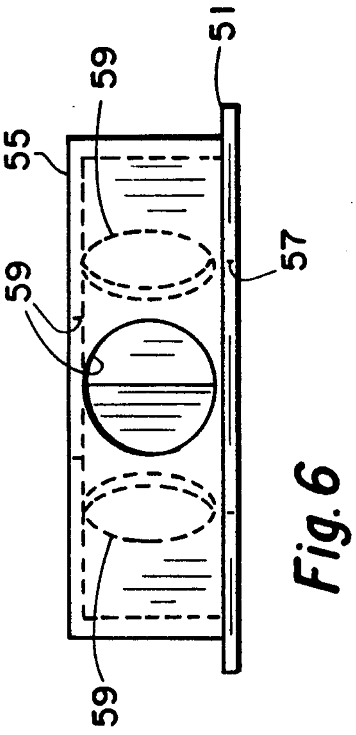
FIG. 6 is a bottom plan view of a horizontal triangular air chamber for combining four auxiliary loudspeakers and a single radiating loudspeaker.

Turning finally to FIGS. 6 and 7, an arrangement defining a horizontal triangular air chamber for a compound driver loudspeaker system is illustrated. This arrangement includes an external baffle board 51 and an internal baffle board formed by three rectangular faces 53 and a single equilaterally triangular face 55. The external baffle board 51 has a large baffle cutout 57 through it and the rectangular faces 53 and the equilaterally triangular face 55 have comparatively smaller baffle cutouts 59 through them. Again, the auxiliary and radiating loudspeakers may be mounted in each of their respective baffle cutouts as hereinbefore described.

The above alternative embodiments illustrate just some of the possible alternatives in speaker numbers and configurations. Any number of auxiliary speakers totalling two or more may be employed. The operational characteristics of the device will be determined by the user's subjective selection and matching of loudspeakers and the air chamber configuration. The guiding criteria for the establishment of the air chamber configuration is to minimize the volume defined by the configuration.

A common selection of Thiele-Small parameters for the internal drivers might be an Fs equal to the external driver, an equivalent single driver Vas equal to the external driver, and a Qts adjusted to provide an equivalent single driver sensitivity equal to the external driver. However, different combinations of driver parameters could provide a large number of resulting system responses.

Thus, it is apparent that there has been provided, in accordance with the invention, a multiple sub-woofer speaker cabinet that fully satisfies the objects, aims and advantages set forth above. While the invention has been described in conjunction with specific embodiments thereof, it is evident that many alternatives, modifications and variations will be apparent to those skilled in the art and in light of the foregoing description. Accordingly, it is intended to embrace all such alternatives, modifications and variations as fall within the spirit of the appended claims.

What is claimed is:

1. A compound driver loudspeaker system comprising:

a loudspeaker cabinet having an external baffleboard having a baffle cutout therethrough and an internal baffleboard having a plurality of baffle cutouts therethrough;

an exterior radiating loudspeaker mounted in said baffle cutout of said external baffleboard and radiating outwardly of said cabinet; and a plurality of internal auxiliary loudspeakers, one mounted in each of said baffle cutouts of said internal baffleboard and radiating toward said exterior radiating loudspeaker, said baffleboards and said loudspeakers defining an air chamber therebetween, each of said auxiliary loudspeakers being insertable into and removable from said air chamber through said baffle cutout in said external baffleboard.

2. A compound driver loudspeaker system comprising:

a loudspeaker cabinet having an external baffleboard having a baffle cutout therethrough and an internal baffleboard having a plurality of baffle cutouts therethrough;

an exterior radiating loudspeaker mounted in said baffle cutout of said external baffleboard;

a plurality of internal auxiliary loudspeakers, one mounted in each of said baffle cutouts of said internal baffleboard, parameters selected so as to form an equivalent single driver matched to said radiating loudspeaker to provide optimal low frequency performance of said system; and said baffleboards and said loudspeakers defining an air chamber therebetween, each of said auxiliary loudspeakers being insertable into and removable from said air chamber through said baffle cutout in said external baffleboard.

3. A system according to claim 2, said radiating loudspeaker being mounted on an exterior surface of said external baffleboard.

4. A system according to claim 3, said auxiliary loudspeakers being mounted on an exterior surface of said internal baffleboard.

5. A system according to claim 4, said internal baffleboard having two rectangular faces cooperable with said external baffleboard to define a vertical, triangular air chamber, each said face having one baffle cutout therethrough.

6. A system according to claim 5, said face cutouts being of equal diameter and said auxiliary loudspeakers being of equal diameter.

7. A system according to claim 6, said auxiliary loudspeakers being mounted symetrically in relation to said radiating loudspeaker.

8. A compound driver loudspeaker system comprising:

a loudspeaker cabinet having an external baffleboard having a baffle cutout therethrough and an internal baffleboard having a plurality of baffle cutouts therethrough, said internal baffleboard having four triangular faces cooperable with said external baffleboard to define a pyramid-like air chamber, each said face having one baffle cutout therethrough;

an exterior radiating loudspeaker mounted in said baffle cutout of said external baffleboard, said radiating loudspeaker being mounted on an exterior surface of said external baffleboard;

a plurality of internal auxiliary loudspeakers, one mounted in each of said baffle cutouts of said internal baffleboard, said auxiliary loudspeaker being mounted on an exterior surface of said internal baffleboard, and said baffleboards and said loudspeakers defining an air chamber therebetween, each of said auxiliary loudspeakers being insertable into and removable from said air chamber through said baffle cutout in said external baffleboard.

9. A system according to claim 8, said face cutouts being of equal diameter and said auxiliary loudspeakers being of equal diameter.

10. A system according to claim 9 said auxiliary loudspeakers being mounted symetrically in relation to said radiating loudspeaker.

11. A system according to claim 4, said internal baffleboard having two rectangular faces cooperable with said external baffleboard to define a vertical triangular air chamber, each said face having two baffle cutouts therethrough.

12. A system according to claim 11, said face cutouts being of equal diameter and said auxiliary loudspeakers being of equal diameter.

13. A system according to claim 12, said auxiliary loudspeakers being mounted symetrically in relation to said radiating loudspeaker.

14. A compound driver loudspeaker system comprising:

a loudspeaker cabinet having an external baffleboard having a baffle cutout therethrough and an internal baffleboard having a plurality of baffle cutouts therethrough, said internal baffleboard having three rectangular faces and an equilaterally triangular face cooperable with said external baffleboard to define a horizontal triangular air chamber, each said face having one baffle cutout therethrough;

an exterior radiating loudspeaker mounted in said baffle cutout of said external baffleboard, said radiating loudspeaker being mounted on an exterior surface of said external baffleboard;

a plurality of internal auxiliary loudspeakers, one mounted in each of said baffle cutouts of said internal baffleboard, said auxiliary loudspeakers being mounted on an exterior surface of said internal baffleboard; and said baffleboards and said loudspeakers defining an air chamber therebetween, each of said auxiliary loudspeakers being insertable into and removable from said air chamber through said baffle cutout in said external baffleboard.

15. A system according to claim 14, said face cutouts being of equal diameter and said auxiliary loudspeakers being of equal diameter.

16. A system according to claim 15, said auxiliary loudspeakers being mounted symetrically in relation to said radiating loudspeaker.

17. A compound driver loudspeaker system comprising:

a loudspeaker cabinet having an external baffleboard having a baffle cutout therethrough and an internal baffleboard having a plurality of baffle cutouts therethrough;

an exterior radiating loudspeaker front mounted in said baffle cutout of said external baffleboard and radiating outwardly of said cabinet; and a plurality of internal auxiliary loudspeakers, one front mounted in each of said baffle cutouts of said internal baffleboard and radiating toward said exterior radiating loudspeaker, said baffleboards and said loudspeakers defining an air chamber therebetween, each of said auxiliary loudspeakers being insertable into and removable from said air chamber through said baffle cutout in said external baffleboard.

18. A compound driver loudspeaker system comprising:

a loudspeaker cabinet having an external baffleboard having a baffle cutout therethrough and an internal baffleboard having a plurality of baffle cutouts therethrough;

an exterior radiating loudspeaker front mounted in said baffle cutout of said external baffleboard;

a plurality of internal auxiliary loudspeakers, one front mounted in each of said baffle cutouts of said internal baffleboard, said auxiliary loudspeakers having parameters selected so as to form an equivalent single driver matched to said radiating loudspeaker to provide optimal low frequency performance of said system;

said baffleboards and said loudspeakers defining an air chamber therebetween, each of said auxiliary loudspeakers being insertable into and removable from said air chamber through said baffle cutout in said external baffleboard.

19. A system according to claim 18 having Thiele-Small parameters such that said auxiliary loudspeakers have an equivalent free air resonance frequency and an effective motor strength equal to that of said radiating loudspeaker and an equivalent volume compliance adjusted to provide an equivalent single driver sensitivity equal to that of said radiating loudspeaker.

* * * * *